(12) United States Patent
Song et al.

(10) Patent No.: US 8,299,457 B2
(45) Date of Patent: Oct. 30, 2012

(54) FILLER FOR SEALING ORGANIC LIGHT EMITTING DEVICE AND METHOD FOR MANUFACTURING THE ORGANIC LIGHT EMITTING DEVICE USING THE SAME

(75) Inventors: Seung-Yong Song, Yongin (KR); Young-Seo Choi, Yongin (KR); Oh-June Kwon, Yongin (KR); Ji-Hun Ryu, Yongin (KR); Sun-Young Jung, Yongin (KR); Young-Cheol Joo, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 177 days.

(21) Appl. No.: 12/656,393

(22) Filed: Jan. 28, 2010

(65) Prior Publication Data

US 2011/0057172 A1 Mar. 10, 2011

(30) Foreign Application Priority Data

Sep. 9, 2009 (KR) ........................ 10-2009-0085012

(51) Int. Cl.
*H01L 29/08* (2006.01)
(52) U.S. Cl. ................. 257/40; 257/98; 438/28; 528/10; 528/33

(58) Field of Classification Search .................... 257/40, 257/98; 438/28; 528/10, 33
See application file for complete search history.

(56) References Cited

U.S. PATENT DOCUMENTS

| 5,212,261 A * | 5/1993 | Stierman ........................ 525/506 |
| 2008/0175605 A1* | 7/2008 | Sakurai ............................. 399/4 |

FOREIGN PATENT DOCUMENTS

| JP | 2004-131519 A | 4/2004 |
| JP | 2005-336219 A | 12/2005 |
| JP | 2005336219 | * 12/2005 |
| JP | 2008-153602 A | 7/2008 |

* cited by examiner

*Primary Examiner* — Tan N Tran
(74) *Attorney, Agent, or Firm* — Lee & Morse, P.C.

(57) ABSTRACT

A sealing filler for an organic light emitting device display includes a siloxane polymer having a surface tension of about 20 dyn/cm or less. The siloxane polymer may be represented by

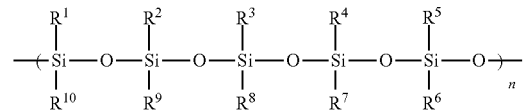

where each of $R^1$ to $R^{10}$ is independently a non-polar substituent, and n ranges from 20 to 50.

16 Claims, 2 Drawing Sheets

FILLER FOR SEALING ORGANIC LIGHT EMITTING DEVICE AND METHOD FOR MANUFACTURING THE ORGANIC LIGHT EMITTING DEVICE USING THE SAME

BACKGROUND

1. Field

Example embodiments relate to a filler for sealing an organic light emitting device display and a method of manufacturing the organic light emitting device display.

2. Description of the Related Art

An organic light emitting device is a self-light emitting display that emits light by electrically exciting an organic compound. The organic light emitting device may be operable at a low voltage and may exhibit high visibility and quick response rate. Since the organic light emitting device is light and thin, it is drawing attention as the next-generation display.

The organic compound of the organic light emitting device, however, may deteriorate when exposed to moisture and/or oxygen. Therefore, the organic light emitting device may include an encapsulating member, e.g., an encapsulation substrate, thereon to provide protection from moisture and/or oxygen. A conventional encapsulation substrate, however, may be easily damaged by external impact or pressure.

SUMMARY

Embodiments are therefore directed to a filler for sealing an organic light emitting device and a method of manufacturing the same, which substantially overcome one or more of the problems due to the limitations and disadvantages of the related art.

It is therefore a feature of an embodiment to provide a filler for hermetically sealing an organic light emitting device display to protect the organic light emitting device display from external impact or pressure.

It is another feature of an embodiment to provide a method for manufacturing an organic light emitting device display having a filler for hermetically sealing the organic light emitting device display.

At least one of the above and other features and advantages may be realized by providing a filler for hermetically sealing an organic light emitting device display, including a siloxane polymer with a surface tension of about 20 dyn/cm or less. The siloxane polymer may be represented by the following Chemical Formula 1.

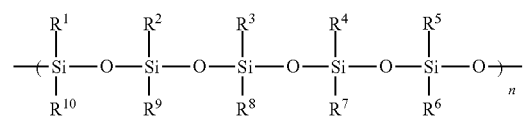

In Chemical Formula 1, each of $R^1$ to $R^{10}$ may be independently a non-polar substituent, and n may range from 20 to 50. Each of $R^1$ to $R^{10}$ may be independently one of an alkyl, an aryl, and ether. The alkyl may be a C4 to C20 alkyl, the aryl may be a C6 to C20 aryl, and the ether may be a C4 to C20 ether. The siloxane polymer may have a surface tension of about 18 dyn/cm or less.

At least one of the above and other features and advantages may also be realized by providing a method for manufacturing an organic light emitting device display, including forming an organic light emitting diode array on a substrate, coating an encapsulation substrate with a filler, the filler including a siloxane polymer having a surface tension of about 20 dyn/cm or less, laminating the encapsulation substrate with the substrate, such that the organic light emitting diode and filler are sealed between the encapsulation substrate and the substrate. The lamination may be performed at a pressure ranging from about 0 torr to about 760 torr. The siloxane polymer may be represented by the following Chemical Formula 1.

$$\begin{array}{c} R^1 \quad R^2 \quad R^3 \quad R^4 \quad R^5 \\ | \quad | \quad | \quad | \quad | \\ -(Si-O-Si-O-Si-O-Si-O-Si-O)_n- \\ | \quad | \quad | \quad | \quad | \\ R^{10} \quad R^9 \quad R^8 \quad R^7 \quad R^6 \end{array}$$

[Chemical Formula 1]

In the Chemical Formula 1, each of $R^1$ to $R^{10}$ may be independently a non-polar substituent, and n may range from 20 to 50. Each of $R^1$ to $R^{10}$ may be independently one of an alkyl, an aryl, and ether. The alkyl may be to a C4 to C20 alkyl, the aryl may be C6 to C20 aryl, and the ether may be a C4 to C20 ether. The siloxane polymer may have surface tension of about 18 dyn/cm or less.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
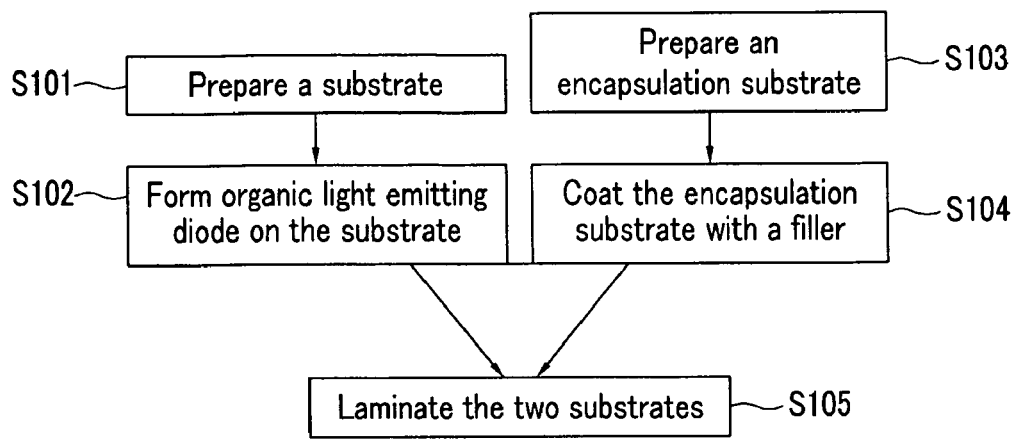
FIG. 1 illustrates a flowchart of a method for manufacturing an organic light emitting device display according to an embodiment.

Korean Patent Application No. 10-2009-0085012, filed on Sep. 9, 2009, in the Korean Intellectual Property Office, and entitled: "Filler for Sealing Organic Light Emitting Device and Method for Manufacturing the Organic Light Emitting Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

According to example embodiments, an organic light emitting device display, i.e., an organic light emitting diode (OLED) display device, may include an organic light emitting diode array sealed between a substrate and an encapsulation substrate, and a filler surrounding the organic light emitting diode array and filling a space between the substrate and the encapsulation substrate. The filler may hermetically seal the organic light emitting device display, and may include a siloxane polymer having a surface tension of about 20 dyn/cm or less. For example, the siloxane polymer may have a surface tension of about 18 dyn/cm or less.

When the filler has a surface tension of about 20 dyn/cm, it may be possible to apply the filler to the organic light emitting device display, i.e., fill the organic light emitting device display, under atmospheric or substantial atmospheric pressure conditions. When the surface tension of the filler is higher than 20 dyn/cm, the filler may not be properly, e.g., uniformly, applied to active pixel regions of the organic light emitting device display under atmospheric pressure conditions because of the attraction among the filler particles, thereby reducing a desired effect of the filler in the organic light emitting device display. While a conventional filler with a high surface tension may be applied to an organic light emitting device display under vacuum condition, such conditions may increase manufacturing time and costs, e.g., requiring acquisition of a separate vacuum chamber. Therefore, since the filler according to an embodiment includes a siloxane polymer with a surface tension of about 20 dyn/cm or less, it may be possible to apply the filler to the organic light emitting device display under atmospheric pressure conditions, i.e., without using a separate vacuum chamber. As such, manufacturing costs and time may be substantially reduced.

The siloxane polymer may be represented by the following Chemical Formula 1.

[Chemical Formula 1]

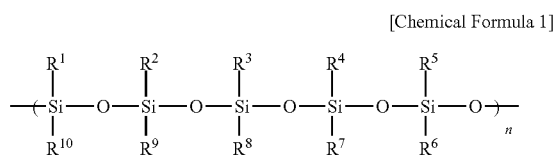

In the Chemical Formula 1, each of $R^1$ to $R^{10}$ may be independently a non-polar substituent, and n may range from 20 to 50. The polymer characteristic as a filler may be achieved when n ranges from 20 to 50.

In order to minimize the attraction between molecules of the filler, i.e., in order to reduce surface tension, the substituents $R^1$ to $R^{10}$ are non-polar substituents. For the non-polar substituent, each of $R^1$ to $R^{10}$ may be independently one of an alkyl, an aryl, and an ether.

Proximity, e.g., affinity, between the siloxane polymers in the filler may be adjusted, e.g., restricted, in order to reduce the surface tension of the filler. For example, the substituents $R^1$ to $R^{10}$ may have a high molecular weight. For example, the molecular weight of each of the substituents $R^1$ to $R^{10}$ may range from about 16,000 to about 162,000.

For example, an alkyl substituent may be a C4 to C20 alkyl, an aryl substituent may be a C6 to C20 aryl, and an ether substituent may be a C4 to C20 ether. With the number of carbon atoms falling in the above range, a desired surface tension for the filler, i.e., a surface tension of about 20 dyn/cm or less, may be acquired.

Examples of the alkyl substituents may include butyl, pentyl, hexyl, 3-ethyl hexyl, and the like. Examples of the aryl substituent may include phenyl, naphthyl, tri-phenyl, and the like. Examples of the ether substituent may include ethyl propyl ether, ethylbutyl ether, and the like.

A method for manufacturing an organic light emitting device display according to an embodiment will be described hereinafter with reference to FIG. 1. FIG. 1 illustrates a flowchart describing a method for manufacturing an organic light emitting device display according to an embodiment.

First, referring to FIG. 1, a substrate may be prepared in operation S101, and an organic light emitting diode array including at least one organic light emitting diode may be formed on the substrate in operation S102. The organic light emitting diode may include a first electrode, an emission layer, and a second electrode.

The substrate may be formed, e.g., of glass and/or a transparent plastic material. The organic light emitting diode array may include at least one organic light emitting diode with the first electrode, the emission layer, and the second electrode formed therein. The first electrode may have a plurality of thin film transistors in a lower portion, and the first electrode may be electrically connected to a drain of a thin film transistor. Any one of the first electrode and the second electrode may be an anode, and the other may be a cathode. In the organic light emitting diode, when a predetermined voltage is applied to the anode and the cathode, holes implanted in the anode are transferred to the emission layer through a hole transport layer (HTL), and electrons implanted in the cathode are transferred to the emission layer through an electron transport layer (ETL). The electrons and the holes are re-combined in the emission layer to produce excitons, and as the state of the excitons is changed from an excited state to a base state, the organic material of the emission layer emits light to realize an image. A color of the emitted light may vary according to the organic material in the emission layer of the organic light emitting diode, and lights of various grayscales may be realized using organic materials representing red, green, and blue colors.

The encapsulation substrate maybe prepared in operation S103. The encapsulation substrate may be coated with a filler including a siloxane polymer having a surface tension of about 20 dyn/cm or less in operation S104. Then, the encapsulation substrate may be attached to the substrate, i.e., to hermetically seal the organic light emitting diode, in operation S105. Operations S104 and S105 may be performed at atmospheric pressure, e.g., about 760 torr or substantially close to about 760, so special equipment or manufacturing conditions, e.g., for providing vacuum, may not be required for manufacturing the organic light emitting device display according to an embodiment.

The encapsulation substrate may be formed, e.g., of glass, metal, plastic, and/or silicon oxide. The filler may include the siloxane polymer having a surface tension of about 20 dyn/cm or less, as described previously.

When a filler having a surface tension of about 20 dyn/cm or less is used, a device may be filled with the filler under atmospheric pressure conditions. In contrast, when the filler has a high surface tension, e.g., above 20 dyn/cm, active pixel regions may be hardly filled due to the affinity between the filler molecules at atmospheric pressure. Thus, the effect of the filler may not be sufficiently acquired. Further, filling a conventional filler with a high surface tension under vacuum conditions may be costly due to costs associated with acquisition and/or manufacturing of a separate vacuum chamber.

The siloxane polymer according to example embodiments may have a surface tension of about 18 dyn/cm or less. The siloxane polymer may be represented by the following Chemical Formula 1.

[Chemical Formula 1]

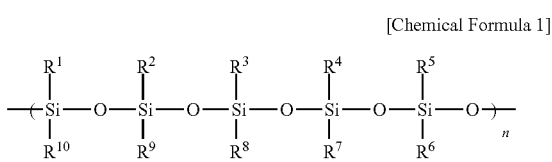

In the Chemical Formula 1, each of $R^1$ to $R^{10}$ may be independently a non-polar substituent, and n may range from 20 to 50. The substituents $R^1$ to $R^{10}$ may be non-polar substituents in order to minimize the attraction between the molecules. Each of the non-polar substituents $R^1$ to $R^{10}$ may be independently one of an alkyl, an aryl, and an ether.

The proximity between the polymers in the filler may be restricted to reduce the surface tension of the filler by having substituents with a high molecular weight. For example, the molecular weight of each substituent may range from about 16,000 to about 162,000.

The alkyl substituent may be a C4 to C20 alkyl, the aryl substituent may be a C6 to C20 aryl, and the ether substituent may be a C4 to C20 ether. The filler may have the desired surface tension when the number of carbon atoms falls in the above range.

Examples of the alkyl substituent may include butyl, pentyl, hexyl, 3-ethyl hexyl, and the like. Examples of the aryl substituent may include phenyl, naphthyl, tri-phenyl, and the like. Examples of the ether substituent may include ethyl propyl ether, ethylbutyl ether, and the like.

Referring back to FIG. 1, before, during, or after the encapsulation substrate is coated with the filler in operation S104, a sealing member may be formed on the encapsulation substrate to correspond to the edge portion of the organic light emitting diode array. The sealing member may laminate the substrate with the encapsulation substrate in operation S105. For example, the sealing member may include fit, e.g., one or more of $K_2O$, $Fe_2O_3$, $Sb_2O_3$, $ZnO$, $P_2O_5$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rb_2O$, $Rh_2O$, $CuO$, and $Bi_2O_3$.

The sealing member may be formed to be spaced apart from the filler inwardly, e.g., by a distance of about 100 µm to about 300 µm. Since the sealing member is spaced apart from the filler, it may be possible to prevent the filler from being deformed due to the heat generated when the sealing member is cured. For example, the sealing member and the filler may be formed on the encapsulation substrate through a deposition method, printing, or dripping.

The sealing member of the laminated organic light emitting device display may be cured by irradiating a laser or ultraviolet rays (UV). Next, the organic light emitting device display may be put into a heat chamber to cure the filler.

Figure 2:
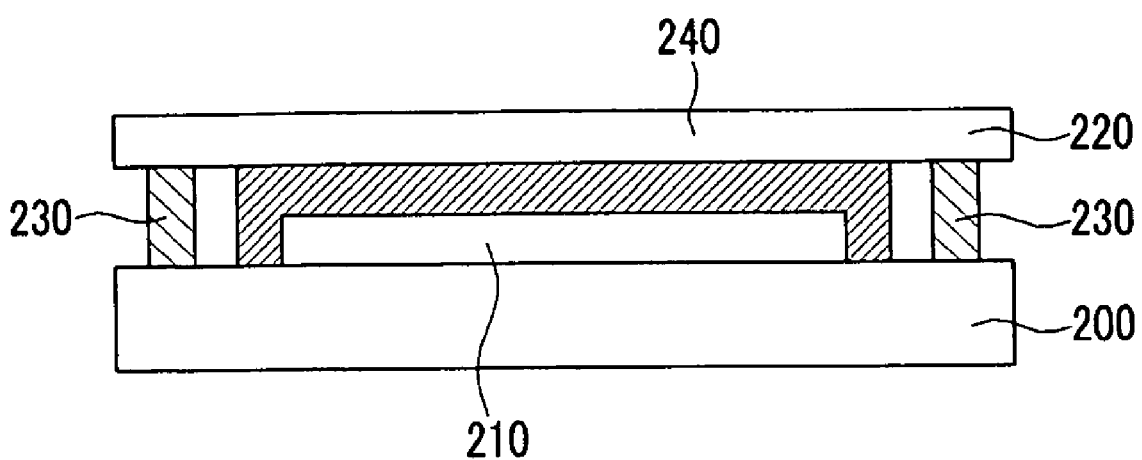
FIG. 2 illustrates an organic light emitting device display with a filler according to an embodiment.

FIG. 2 illustrates a cross-sectional view of an organic light emitting device display with a filler according to an embodiment. Referring to FIG. 2, the organic light emitting device display may include a substrate 200, an organic light emitting diode array 210 formed on the substrate 200 and including at least one organic light emitting diode, an encapsulation substrate 220, a sealing member 230 for laminating the substrate 200 with the encapsulation substrate 220, and a filler 240 filling the space between the substrate 200 and the encapsulation substrate 220. The filler 240 may be the siloxane polymer having a surface tension of about 20 dyn/cm or less, as described previously.

The filler 240 may cover the organic light emitting device array 210, e.g., the organic light emitting device array 210 may be completely encapsulated between the filler 240 and the substrate 200. The filler 240 may fill the space between the substrate 200 and the encapsulation substrate 220, e.g., completely fill a space between the organic light emitting device array 210 and the encapsulation substrate 220. The filler 240 may protect the organic light emitting device display from external impact and/or pressure.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A sealing filler for an organic light emitting device display comprising a siloxane polymer having a surface tension of about 20 dyn/cm or less.

2. The sealing filler as claimed in claim 1, wherein the siloxane polymer is represented by the following formula:

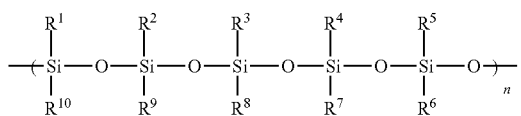

wherein in the formula, each of $R^1$ to $R^{10}$ is independently a non-polar substituent, and n ranges from 20 to 50.

3. The sealing filler as claimed in claim 2, wherein each of $R^1$ to $R^{10}$ is independently one of an alkyl, an aryl, and ether.

4. The sealing filler as claimed in claim 3, wherein the alkyl is a C4 to C20 alkyl, the aryl is a C6 to C20 aryl, and the ether is a C4 to C20 ether.

5. The sealing filler as claimed in claim 2, wherein the siloxane polymer has surface tension of about 18 dyn/cm or less.

6. The sealing filler as claimed in claim 2, wherein the molecular weight of each of $R^1$ to $R^{10}$ is independently from about 16,000 to about 162,000.

7. A method for manufacturing an organic light emitting device display, comprising:

forming an organic light emitting diode array on a substrate;

coating an encapsulation substrate with a filler, the filler including a siloxane polymer having a surface tension of about 20 dyn/cm or less; and laminating the encapsulation substrate with the substrate, such that the organic light emitting diode array and filler are sealed between the encapsulation substrate and the substrate.

8. The method as claimed in claim 7, wherein laminating the encapsulation substrate with the substrate is performed at a pressure range from about 0 torr to about 760 torr.

9. The method as claimed in claim 8, wherein laminating the encapsulation substrate with the substrate is performed at an atmospheric pressure.

10. The method of as claimed in claim 7, wherein the siloxane polymer is represented by the following formula:

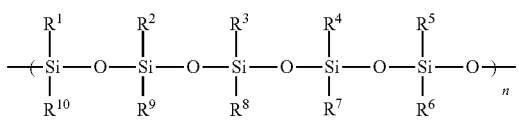

wherein in the formula, each of $R^1$ to $R^{10}$ is independently a non-polar substituent, and n ranges from 20 to 50.

11. The method as claimed in claim 10, wherein each of $R^1$ to $R^{10}$ is independently one of an alkyl, an aryl, and ether.

12. The method as claimed in claim 11, wherein the alkyl is a C4 to C20 alkyl, and the aryl is a C6 to C20 aryl, and the ether is a C4 to C20 ether.

13. The method as claimed in claim 10, wherein the siloxane polymer has a surface tension of about 18 dyn/cm or less.

14. An organic light emitting device display, comprising:
an organic light emitting diode array on a substrate;
an encapsulation substrate on the substrate, the organic light emitting diode array being between the encapsulation substrate and the substrate; and
a filler between the substrate and the encapsulation substrate, the filler including a siloxane polymer having a surface tension of about 20 dyn/cm or less.

15. An organic light emitting device display claimed in claim 14, wherein the siloxane polymer is represented by the following formula:

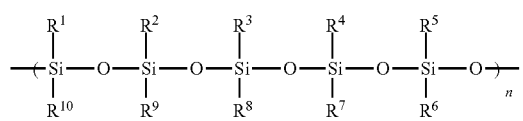

wherein in the formula, each of $R^1$ to $R^{10}$ is independently a non-polar substituent, and n ranges from 20 to 50.

16. The organic light emitting device display claimed in claim 15, wherein the molecular weight of each of $R^1$ to $R^{10}$ is independently from about 16,000 to about 162,000.

* * * * *